(12) United States Patent
Katsunuma

(10) Patent No.: US 10,916,442 B2
(45) Date of Patent: Feb. 9, 2021

(54) ETCHING METHOD

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/867,388

(22) Filed: Jan. 10, 2018

(65) Prior Publication Data

US 2018/0130670 A1 May 10, 2018

Related U.S. Application Data

(63) Continuation of application No. 15/183,976, filed on Jun. 16, 2016, now Pat. No. 9,899,232.

(30) Foreign Application Priority Data

Jun. 23, 2015 (JP) .................. 2015-125773

(51) Int. Cl.
*H01L 21/768* (2006.01)
*H01L 21/3213* (2006.01)
*H01L 21/311* (2006.01)
*H01L 21/308* (2006.01)
*H01L 21/3065* (2006.01)
(Continued)

(52) U.S. Cl.
CPC ...... *H01L 21/31144* (2013.01); *H01L 21/027* (2013.01); *H01L 21/033* (2013.01); *H01L 21/308* (2013.01); *H01L 21/30655* (2013.01); *H01L 21/31116* (2013.01); *H01L 21/32136* (2013.01); *H01L 21/76862* (2013.01); *H01J 2237/334* (2013.01); *H01L 21/3065* (2013.01)

(58) Field of Classification Search
None
See application file for complete search history.

(56) References Cited

U.S. PATENT DOCUMENTS 6,423,175 B1 * 7/2002 Huang ............ H01J 37/32642
156/345.51
2003/0162395 A1 * 8/2003 Trapp ............... H01L 21/31116
438/689

(Continued)

FOREIGN PATENT DOCUMENTS

JP 2006-269879 A 10/2006
JP 2013-98193 A 5/2013

*Primary Examiner* — Stephanie P Duclair
(74) *Attorney, Agent, or Firm* — Rothwell, Figg, Ernst & Manbeck, P.C.

(57) ABSTRACT

Disclosed is a method for etching an etching target layer which contains silicon and is provided with a metal-containing mask thereon. The method includes: generating plasma of a first processing gas containing a fluorocarbon gas in a processing container that accommodates the etching target layer and the mask to form a fluorocarbon-containing deposit on the mask and the etching target layer; and generating plasma of a second processing gas containing an inert gas in the processing container to etch the etching target layer by radicals of the fluorocarbon contained in the deposit. A plurality of sequences, each including the generating the plasma of the first processing gas and the generating the plasma of the second processing gas, are performed.

30 Claims, 16 Drawing Sheets

(51) Int. Cl.
*H01L 21/033* (2006.01)
*H01L 21/027* (2006.01)

(56) References Cited

U.S. PATENT DOCUMENTS

| | | | |
|---|---|---|---|
| 2006/0151116 A1* | 7/2006 | Wu | C23F 4/00 156/345.46 |
| 2007/0128871 A1* | 6/2007 | Yamanaka | H01J 37/32082 438/689 |
| 2009/0242516 A1 | 10/2009 | Honda et al. | |
| 2012/0302067 A1* | 11/2012 | Subramanian | H01L 21/3065 438/700 |
| 2013/0105947 A1* | 5/2013 | Fuller | H01L 21/30655 257/618 |
| 2014/0077126 A1* | 3/2014 | Benson | H01L 21/31116 252/79.1 |
| 2014/0120726 A1 | 5/2014 | Nemani et al. | |

\* cited by examiner

FIG. 15

|  | Test Example 8 | | | Comparative Test Example 8 | | |
|---|---|---|---|---|---|---|
|  | Center | 10 mm from edge | 5 mm from edge | Center | 10 mm from edge | 5 mm from edge |
| MH (nm) | 29 | 27 | 28 | 30 | 26 | 17 |
| TCD (nm) | 33.6 | 33.5 | 34.3 | 35.8 | 35.3 | 39.3 |
| Depth (nm) | 196 | 205 | 198 | 199 | 208 | 204 |

ETCHING METHOD

CROSS-REFERENCE TO RELATED APPLICATIONS

This application is a Continuation of U.S. patent application Ser. No. 15/183,976, filed on Jun. 16, 2016, which claims priority from Japanese Patent Application No. 2015-125773 filed on Jun. 23, 2015 with the Japan Patent Office, all of which are incorporated herein by reference.

TECHNICAL FIELD

An exemplary embodiment of the present disclosure relates to a method for etching an etching target layer provided with a metal-containing mask thereon.

BACKGROUND

In manufacturing electronic devices, openings (e.g., trenches or holes) may be formed in an etching target layer due to etching of the etching target layer in some cases. In general, when the etching target layer contains silicon, plasma of a fluorocarbon gas is generated to etch the etching target layer. The etching target layer is etched by active species of fluorine and/or fluorocarbon from the generated plasma. The etching of the etching target layer using the plasma of fluorocarbon gas is described in Japanese Patent Laid-Open Publication Nos. 2013-098193 and 2006-269879.

Further, Japanese Patent Laid-Open Publication Nos. 2013-098193 and 2006-269879 describe that a focus ring is disposed to surround an edge of a workpiece including the etching target layer. The purpose of using the focus ring is generally to enhance the in-plane uniformity of the etching.

Further, Japanese Patent Laid-Open Publication No. 2013-098193 describes that a metal-made mask is formed on the etching target layer, and a pattern of the mask is transferred to the etching target layer by etching.

SUMMARY

The present disclosure provides a method for etching, the method including: disposing a workpiece having a silicon-containing layer formed with a mask thereon in a processing container that includes a focus ring configured to surround the workpiece; forming a fluorocarbon-containing deposit on the mask, the silicon-containing layer, and the focus ring by plasma of a fluorocarbon gas; and etching the silicon-containing layer using fluorocarbon radicals generated by exposing the deposit to plasma of an inert gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 15 is a table illustrating the results of Test Example 8 and Comparative Test Example 8.

DETAILED DESCRIPTION

Figure 1:
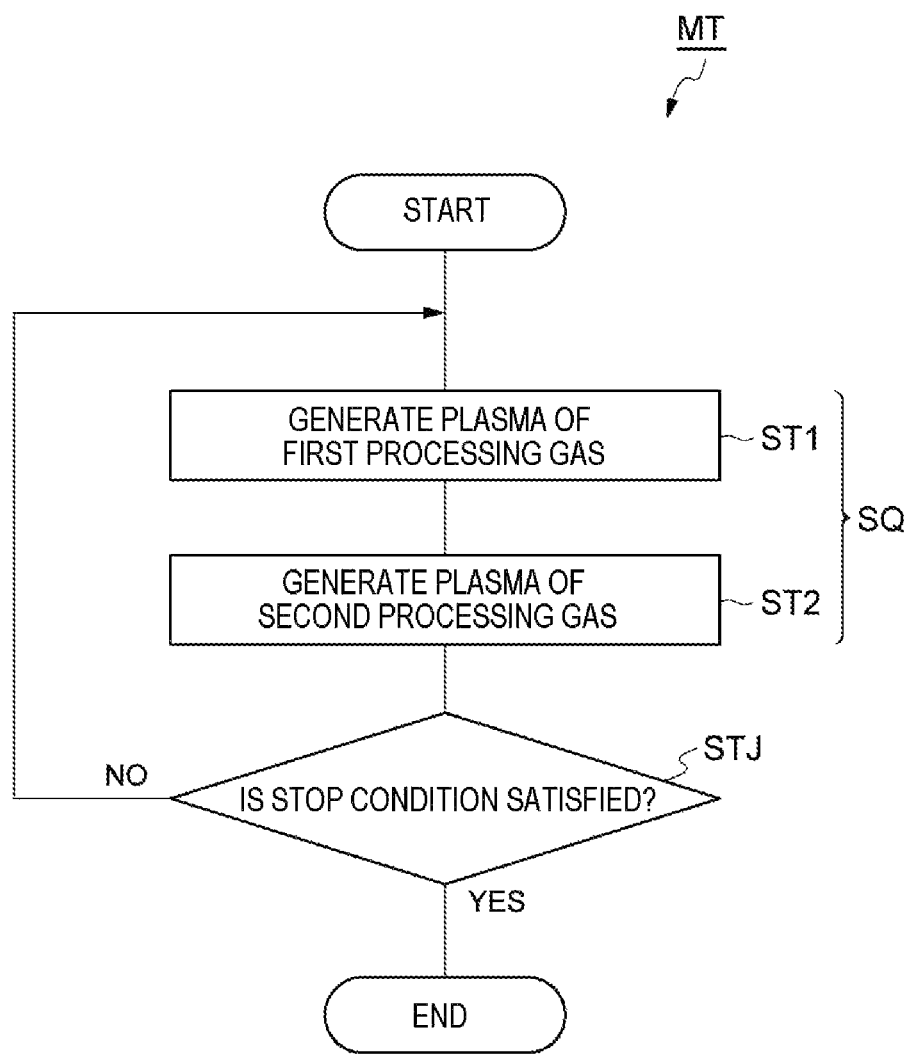
FIG. 1 is a flowchart illustrating an etching method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described etching, the etching rate of the mask in an area close to the focus ring, that is, an edge area of the workpiece, may be increased, as compared with the etching rate of the mask in an area closer to the center of the workpiece than the edge area (i.e., a central area). That is, a selection ratio in the edge area may become lower than a selection ratio in the central area.

Thus, in the etching of the etching target layer that has a metal-containing mask thereon, and contains silicon, it is required to enhance the in-plane uniformity of the selection ratio.

According to an aspect, the present disclosure provides a method for etching an etching target layer. The etching target layer contains silicon and is provided with a metal-containing mask thereon. The method includes (i) generating plasma of a first processing gas containing a fluorocarbon gas within a processing container of a plasma processing apparatus that accommodates a workpiece provided with the mask and the etching target layer thereon to form a fluorocarbon-containing deposit on the mask and the etching target layer (hereinafter, referred to as a "deposition process"); and (ii) generating plasma of a second processing gas containing an inert gas in the processing container to etch the etching target layer by radicals of the fluorocarbon contained in the deposit (hereinafter, referred to as an "etching process"). In the method, a plurality of sequences, each including the deposition process and the etching process, are performed.

In the deposition process of the method according to the aspect, a deposit is formed on the surface of the etching target layer and the mask, that is, the surface of the workpiece. The deposit has a function to protect the mask in the etching process. Further, the deposit serves as a source of radicals of fluorocarbon for the etching of the etching target layer in the etching process. Therefore, according to the method, it is possible to etch the etching target layer while protecting the mask. Further, in the method, the deposit is formed on the workpiece in the deposit process, as well as on an object around the edge of the workpiece, for example, on the focus ring. Thus, after the deposit is formed, the surface of the workpiece and the surface of the object therearound are constituted by the deposit. Accordingly, consumption of fluorine becomes substantially uniform in the substantially entire areas of the surface of the workpiece. Further, the mask is protected by the deposit as described above. Thus, erosion of the mask is substantially uniformly suppressed in the plane of the workpiece. Therefore, according to the method, the in-plane uniformity of the selection ratio is enhanced in the etching of the etching target layer.

In an exemplary embodiment, the second processing gas contains a noble gas or nitrogen gas as the inert gas.

In an exemplary embodiment, the second processing gas contains a noble gas and nitrogen gas as the inert gas. In the exemplary embodiment, an active species of nitrogen is produced. Therefore, when the etching target layer contains hydrogen like a film having, for example, a low dielectric constant, separation of the hydrogen from the etching target layer is facilitated by the active species of the nitrogen, so that the etching target layer is more efficiently etched.

In an exemplary embodiment, the second processing gas further contains an oxygen-containing gas. In the exemplary embodiment, an active species of oxygen is generated by generating the plasma of the oxygen-containing gas. The active species of oxygen contributes to removal of excess deposit. Thus, excessive reduction of the opening of the mask is suppressed. Further, when the workpiece includes an area where the mask provides a wide opening (hereinafter, referred to as a "wide area") and an area where the mask provides a narrow opening (hereinafter, referred to as a "narrow area"), a lot of deposit is formed on the etching target layer in the wide area, as compared with the narrow area. Meanwhile, in the wide area, the deposit amount reduced by the active species of the oxygen is increased, as compared with the narrow area. Therefore, the etching proceeds while reducing the difference between the deposit amount on the etching target layer in the narrow area and the deposit amount on the etching target layer in the wide area. Thus, the difference between the etching rate of the etching target layer in the narrow area and the etching rate of the etching target layer in the wide area is decreased.

In an exemplary embodiment, at least some of the plurality of sequences further include generating plasma of a processing gas containing an oxygen-containing gas and an inert gas in the processing container (hereinafter, referred to as a "flash process"). In the exemplary embodiment, excessive reduction of the opening of the mask is also suppressed by the active species of the oxygen. Further, the difference between the etching rate of the etching target layer in the narrow area and the etching rate of the etching target layer in the wide area is decreased. Further, in the exemplary embodiment, since the flash process and the etching process are separated from each other, the controllability of adjusting the deposit amount is enhanced.

In an exemplary embodiment, the mask is made of titanium nitride. Further, in an exemplary embodiment, a focus ring is disposed to surround an edge of a workpiece having the mask and the etching target layer, over a period of time when the plurality of sequences are performed. The focus ring is made of a material different from the material of which the etching target layer is made.

In an exemplary embodiment, the plasma processing apparatus is a capacitively coupled plasma processing apparatus, and includes an upper electrode having a silicon-made area including a surface that defines a space in the processing container, and a DC power source configured to apply a negative DC voltage to the upper electrode. In the exemplary embodiment, the negative DC voltage is applied to the upper electrode at least in the deposition process. When the negative DC voltage is applied to the upper electrode, positive ions in the processing container collide with the upper electrode, so that silicon is released from the surface of the upper electrode. The released silicon is bonded to the active species of fluorine in the processing container. As a result, the amount of the active species of fluorine in the processing container is decreased. Therefore, according to the exemplary embodiment, the erosion of the mask is further reduced. Further, in the etching process and/or the flash process, the negative DC voltage may also be applied to the upper electrode.

As described above, in the etching of the etching target layer that has a metal-containing mask thereon, and contains silicon, it is possible to enhance the in-plane uniformity of the selection ratio.

Hereinafter, various exemplary embodiments will be described in detail with reference to the drawings. In addition, in the respective drawings, the same or corresponding parts will be denoted by the same symbols.

Figure 2:
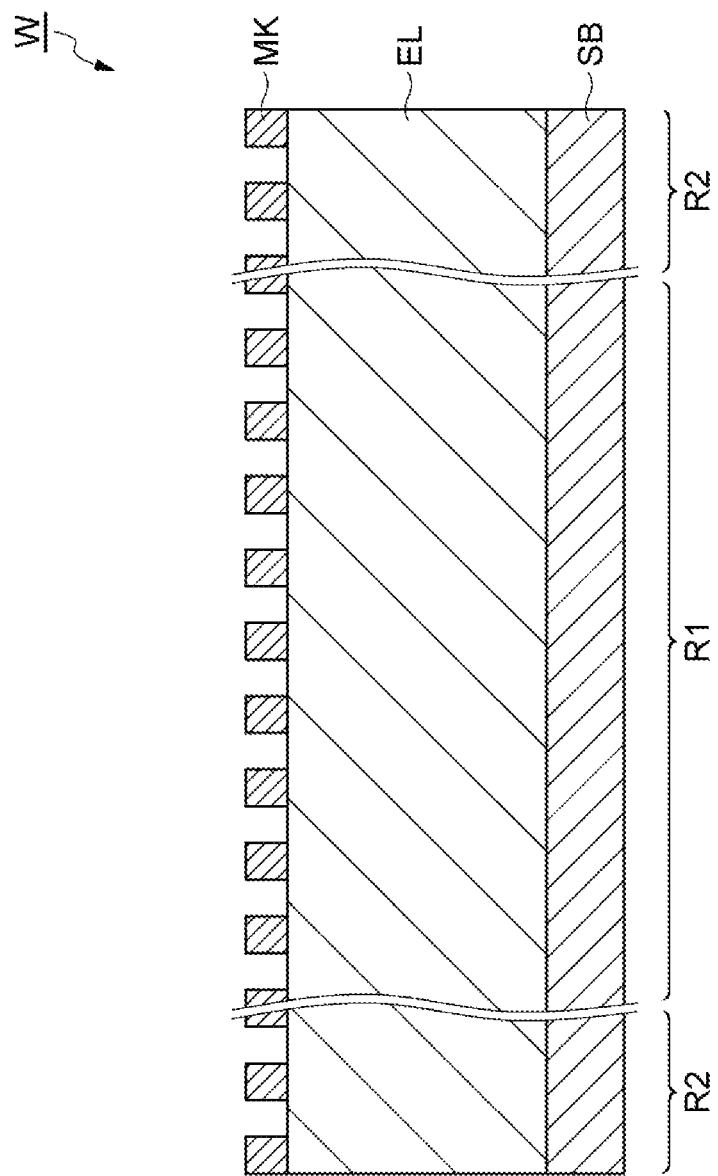
FIG. 2 is a cross-sectional view illustrating an exemplary workpiece.

FIG. 1 is a flowchart illustrating an etching method according to an exemplary embodiment. Method MT illustrated in FIG. 1 is to etch an etching target layer of a workpiece. FIG. 2 is a cross-sectional view illustrating an exemplary workpiece. The workpiece illustrated in FIG. 2 (hereinafter, referred to as a "wafer W") includes a substrate SB, an etching target layer EL, and a mask MK.

The etching target layer EL is a silicon containing layer. The etching target layer EL may be, for example, a silicon oxide film or a low-dielectric constant film (i.e., a Low-K film). When the etching target layer EL is a low-dielectric constant film, examples of the low-dielectric constant film which may be used herein include a SiOC film, a SiOCH film, a $SiO_2$ film, a SiOF film, a Si—H-containing $SiO_2$ film, a hydrogen silsesquioxane (HSQ) film, a porous silica film, a methyl group-containing $SiO_2$ film, a methyl silsesquioxane (MSQ) film, and a porous MSQ film. Further, the etching target layer EL may be a monolayer film of a kind exemplified above, or may have a laminated structure having a plurality of films of two or more kinds exemplified above.

The mask MK is provided on the etching target layer EL. The mask MK contains a metal. The mask MK is made of, for example, titanium nitride (TiN) or tungsten. The mask MK has a pattern that provides a plurality of openings. The openings may be trenches or holes. Further, as described later, the mask MK may include an area that provides a wide opening (i.e., a wide area), and an area that provides a narrow opening (i.e., a narrow area). Further, in the following descriptions, an area including the edge of the wafer W is referred to as an area R2, and an area closer to the center of the wafer W than the area R2 (i.e., a central area) is referred to as an area R1.

Figure 3:
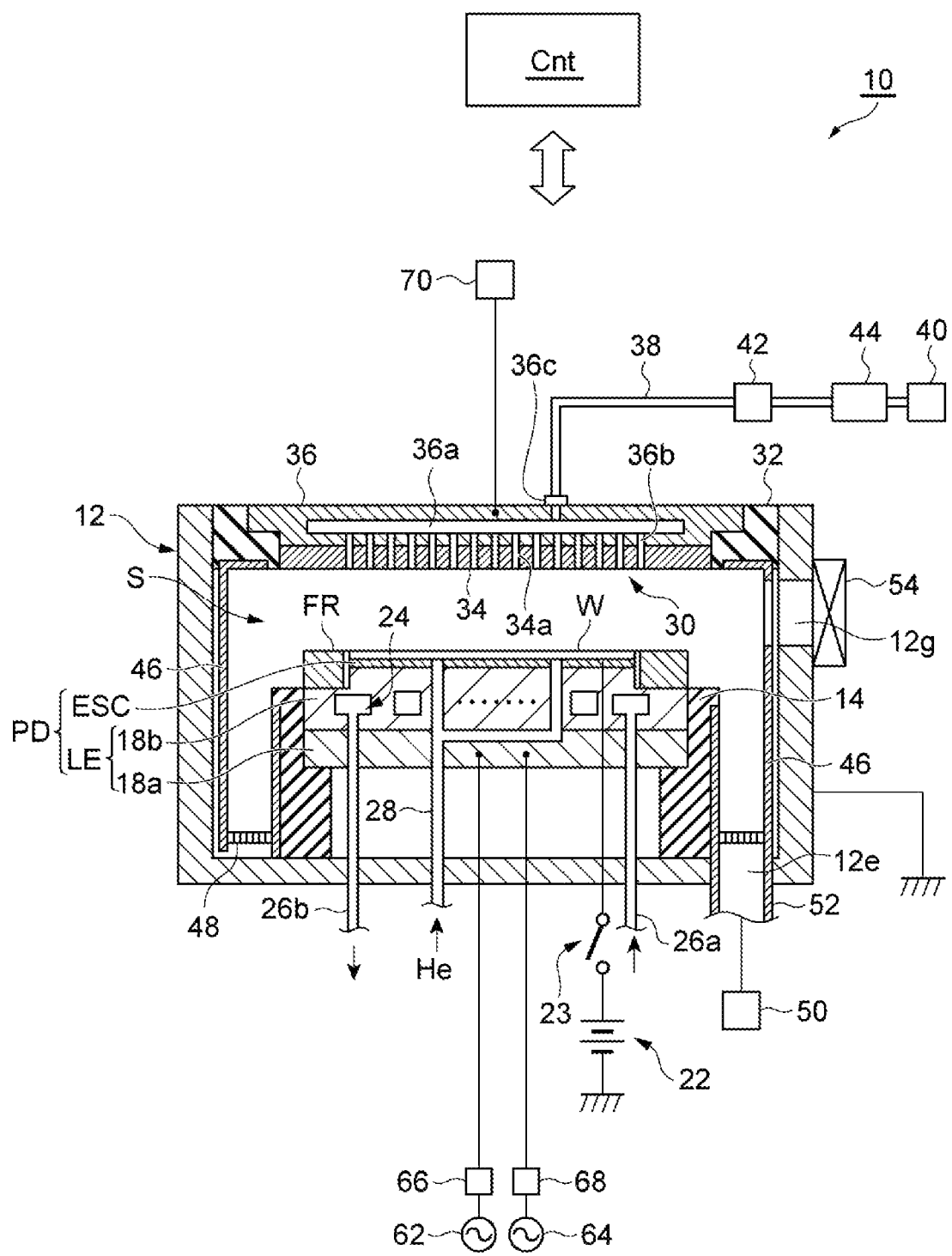
FIG. 3 is a schematic view illustrating an exemplary plasma processing apparatus.

In method MT, a sequence SQ is performed a plurality of times to etch the etching target layer EL of the workpiece such as the wafer W illustrated in FIG. 2. FIG. 3 is a schematic view illustrating an exemplary plasma processing apparatus. The plasma processing apparatus 10 illustrated in FIG. 3 is a capacitively coupled plasma etching apparatus, and includes a substantially cylindrical processing container 12. The processing container 12 is made of, for example, aluminum, and the inner wall surface of the processing container 12 is subjected to anodizing treatment. The processing container 12 is grounded for safety.

A substantially cylindrical support 14 is provided above the bottom portion of the processing container 12. The support 14 is made of, for example, an insulating material. The support 14 extends vertically from the bottom portion of the processing container 12 in the processing container 12. Further, a placing table PD is provided in the processing container 12. The placing table PD is supported by the support 14.

The placing table PD holds the wafer W on the top surface thereof. The placing table PD includes a lower electrode LE and an electrostatic chuck ESC. The lower electrode LE includes a first plate 18a and a second plate 18b. The first plate 18a and the second plate 18b are made of a metal such as, for example, aluminum, and have a substantially disc shape. The second plate 18b is provided on the first plate 18a, and electrically connected to the first plate 18a.

The electrostatic chuck ESC is provided on the second plate 18b. The electrostatic chuck ESC has a structure in which an electrode made of a conductive film is disposed between a pair of insulating layers or insulating sheets. The electrode of the electrostatic chuck ESC is electrically connected with a DC power source 22 via a switch 23. The electrostatic chuck ESC attracts the wafer W through an electrostatic force such as, for example, a Coulomb force caused by a DC voltage from the DC power source 22. Therefore, the electrostatic chuck ESC is capable of holding the wafer W.

A focus ring FR is disposed on the periphery of the second plate 18b to surround the edge of the wafer W and the electrostatic chuck ESC. The focus ring FR has a substantially annular plate shape. The focus ring FR is made of a material different from the mask MK. For example, the focus ring FR is made of silicon.

A coolant flow path 24 is provided inside the second plate 18b. The coolant flow path 24 constitutes a temperature adjustment mechanism. The coolant flow path 24 is supplied with a coolant from a chiller unit provided outside the processing container 12, through a pipe 26a. The coolant supplied to the coolant flow path 24 is returned to the chiller unit through a pipe 26b. In this manner, the coolant is circulated between the coolant flow path 24 and the chiller unit. The temperature of the wafer W supported by the electrostatic chuck ESC is controlled by controlling the temperature of the coolant.

Further, a gas supply line 28 is provided in the plasma processing apparatus 10. The gas supply line 28 supplies a heat transfer gas, for example, helium (He) gas from a heat transfer gas supply mechanism to a gap between the top surface of the electrostatic chuck ESC and the rear surface of the wafer W.

Further, the plasma processing apparatus 10 includes an upper electrode 30. The upper electrode 30 is disposed above the placing table PD to face the placing table PD. Thus, the lower electrode LE and the upper electrode 30 are provided substantially in parallel with each other. A processing space S is provided between the upper electrode 30 and the placing table PD to perform a plasma processing on the wafer W.

The upper electrode 30 is supported in the upper portion of the processing container 12 through an insulating shielding member 32. In an exemplary embodiment, the upper electrode 30 may be configured such that its distance in vertical direction from the top surface of the placing table PD (i.e., the wafer placing surface) is variable. The upper electrode 30 may include a top plate 34 and a support 36. The top plate 34 faces the processing space S, and a plurality of gas ejection holes 34a are formed in the top plate 34. In an exemplary embodiment, the top plate 34 is made of silicon. That is, in an exemplary embodiment, the upper electrode 30 has a silicon-made area including a surface that defines the processing space S in the processing container 12.

The support 36 is configured to detachably support the top plate 34, and may be made of a conductive material such as, for example, aluminum. The support 36 may have a water-cooled structure. A gas diffusion chamber 36a is provided inside the support 36. In the gas diffusion chamber 36a, a plurality of gas flowing holes 36b extend downward to be in communication with the gas ejection holes 34a, respectively. Further, the support 36 includes a gas introduction port 36c configured to introduce the processing gas to the gas diffusion chamber 36a. The gas introduction port 36c is connected with a gas supply pipe 38.

The gas supply pipe 38 is connected with a gas source group 40 via a valve group 42 and a flow rate controller group 44. The gas source group 40 includes a plurality of gas sources. For instance, the gas source group 40 includes a source of a fluorocarbon gas, a source of an inert gas, and a source of an oxygen-containing gas. The gas source group 40 may include, as a source of the fluorocarbon gas, a source of one or more fluorocarbon gases. The fluorocarbon gas may be any fluorocarbon gas such as, for example, $C_4F_8$ gas or $C_4F_6$ gas. In an exemplary embodiment, the source of the inert gas is a source of a noble gas. The noble gas which may be used herein includes any noble gas such as, for example, He gas, Ne gas, Ar gas, Kr gas, or Xe gas. The source of the oxygen-containing gas may be, for example, a source of oxygen gas ($O_2$ gas). Further, the oxygen-containing gas may be any gas containing oxygen, or a carbon oxide gas such as, for example, CO gas or $CO_2$ gas. The gas source group 40 may further include a source of nitrogen gas ($N_2$ gas), as the inert gas, or for the purpose of the reaction with hydrogen in the low-dielectric constant film.

The valve group 42 includes a plurality of valves, and the flow rate controller group 44 includes a plurality of flow rate controllers such as, for example, mass flow controllers. The plurality of gas sources of the gas source group 40 are connected to the gas supply pipe 38 via valves corresponding to the valve group 42 and the flow rate controllers corresponding to the flow rate controller group 44, respectively.

Further, in the plasma processing apparatus 10, a deposition shield 46 is provided detachably along the inner wall of the processing container 12. The deposition shield 46 is provided in the outer periphery of the support 14 as well. The deposition shield 46 serves to suppress any etching byproduct (deposit) from being attached to the processing container 12, and may be formed by coating a ceramic (e.g., $Y_2O_3$) on an aluminum material.

An exhaust plate 48 is provided at the bottom portion side of the processing container 12 between the support 14 and the sidewall of the processing container 12. The exhaust plate 48 includes a plurality of through-holes formed to penetrate the exhaust plate 48 in the plate thickness direction. The exhaust plate 48 may be formed by coating a ceramic (e.g., $Y_2O_3$) on an aluminum material. An exhaust port 12e is formed at the lower side of the exhaust plate 48 in the processing container 12. The exhaust port 12e is connected with an exhaust device 50 via an exhaust pipe 52. The exhaust device 50 includes a pressure adjustment valve and a vacuum pump such as, for example, a turbo molecular pump, and is capable of decompressing the space in the processing container 12 to a desired degree of vacuum. A carry-in/out port 12g of the wafer W is formed in the sidewall of the processing container 12. The carry-in/out port 12g is configured to be opened/closed by a gate valve 54.

Further, the plasma processing apparatus 10 further includes a first high frequency power source 62 and a second high frequency power source 64. The first high frequency power source 62 is a power source that generates high frequency waves for plasma generation, and, for example, generates high frequency at a frequency of 27 MHz to 100 MHz. The first high frequency power source 62 is connected to the lower electrode LE via the matcher 66. The matcher 66 includes a circuit to match the output impedance of the first high frequency power source 62 and the input impedance of the load side (the lower electrode LE side). The first high frequency power source 62 may be connected to the upper electrode 30 via a matcher 66.

The second high frequency power source 64 is a power source that generates a high frequency bias for drawing ions into the wafer W, and, for example, generates a high frequency bias at a frequency in a range of 400 kHz to 13.56 MHz. The second high frequency power source 64 is connected to the lower electrode LE via a matcher 68. The matcher 68 includes a circuit to match the output impedance of the second high frequency power source 64 and the input impedance of the load side (the lower electrode LE side).

Further, the plasma processing apparatus 10 further includes a power source 70. The power source 70 is connected to the upper electrode 30. The power source 70 applies a voltage to the upper electrode 30 to draw positive ions present in the processing space S into the top plate 34. In an example, the power source 70 is a DC power source that generates a negative DC voltage. In another example, the power source 70 may be an AC power source that generates an AC voltage of a relatively low frequency. The voltage applied from the power source 70 to the upper electrode may be a voltage of −150 V or less. That is, the voltage applied to the upper electrode 30 by the power source 70 may be a negative voltage of which the absolute value is 150 V or more. When such a voltage is applied from the power source 70 to the upper electrode 30, positive ions present in the processing space S collide with the top plate 34. Accordingly, second electrons and/or silicon are released from the top plate 34. The released silicon is bonded to the active species of fluorine present in the processing space S, so that the amount of the active species of fluorine is reduced.

Further, in an exemplary embodiment, the plasma processing apparatus 10 may further include a controller Cnt. The controller Cnt is a computer including, for example, a processor, a storage unit, an input device, and a display device, and controls respective parts of the plasma processing apparatus 10. In the controller Cnt, an operator may execute an input operation of a command using the input device to manage the plasma processing apparatus 10, and may visualize and display the operation status of the plasma processing apparatus 10. Further, the storage unit of the controller Cnt stores a control program for controlling various processings to be performed in the plasma processing apparatus 10 by the processor, or a program for performing a processing on respective parts of the plasma processing apparatus 10 in accordance with a processing condition, that is, a processing recipe.

Figure 4:
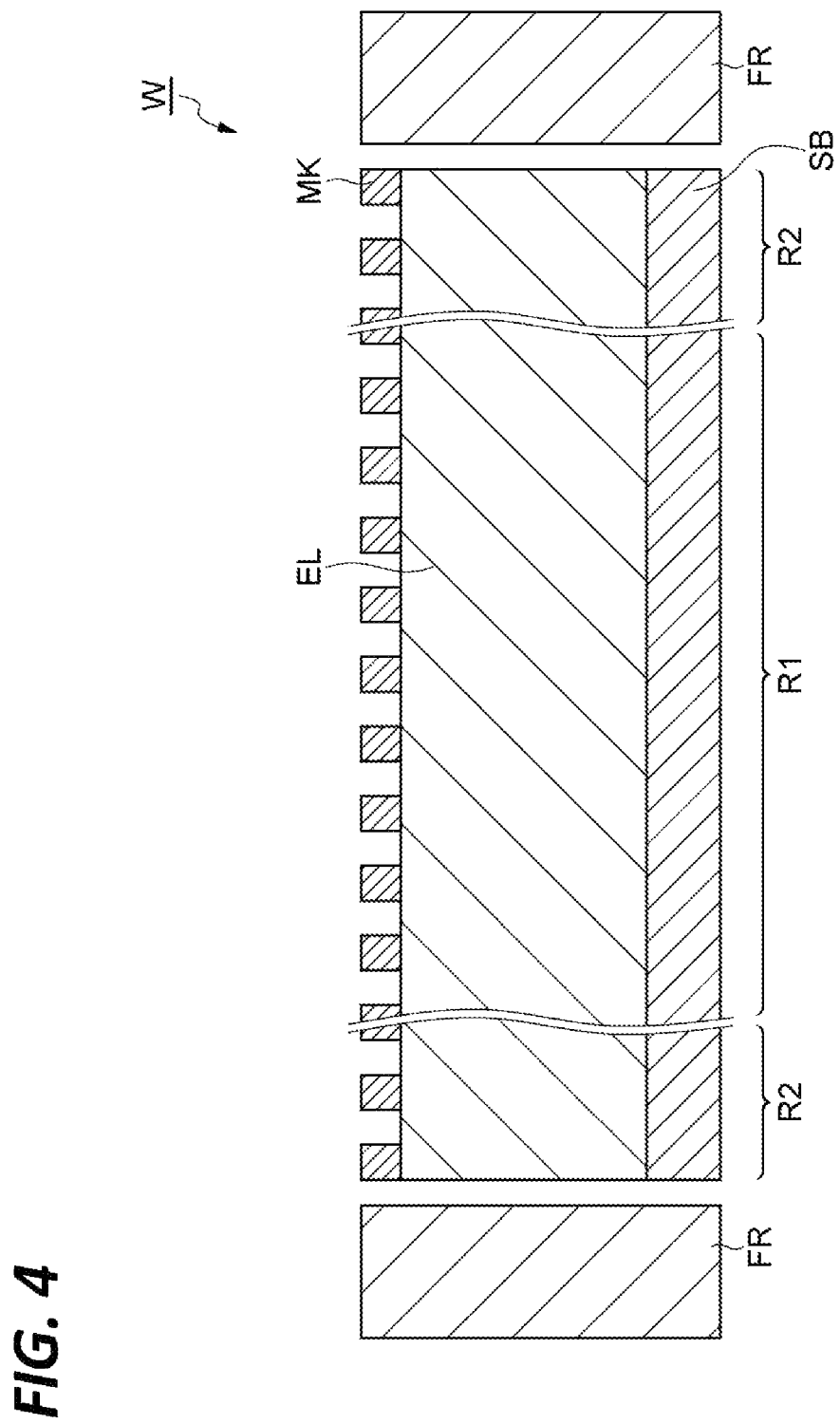
FIG. 4 is a cross-sectional view illustrating the workpiece in a stage during the performance of the method illustrated in FIG. 1.
Figure 5:
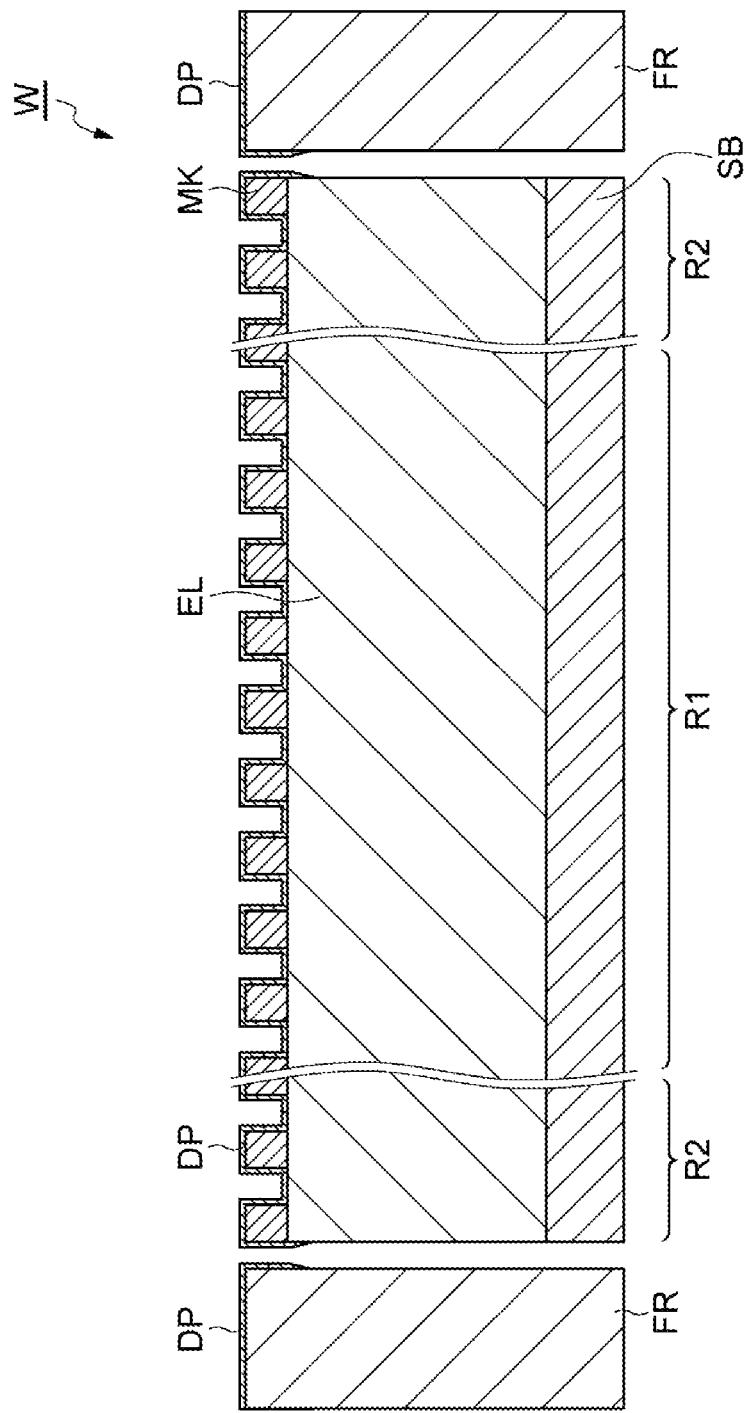
FIG. 5 is a cross-sectional view illustrating the workpiece in a stage during the performance of the method illustrated in FIG. 1.
Figure 6:
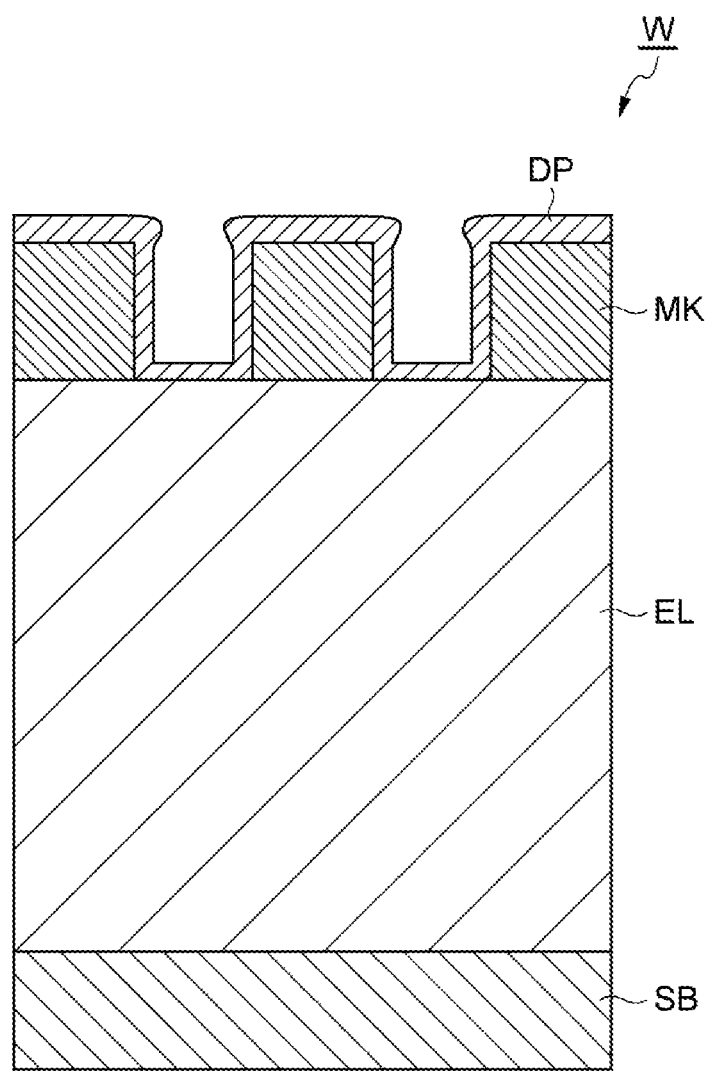
FIG. 6 is an enlarged cross-sectional view illustrating a part of the workpiece in a stage during the performance of the method illustrated in FIG. 1.
Figure 7:
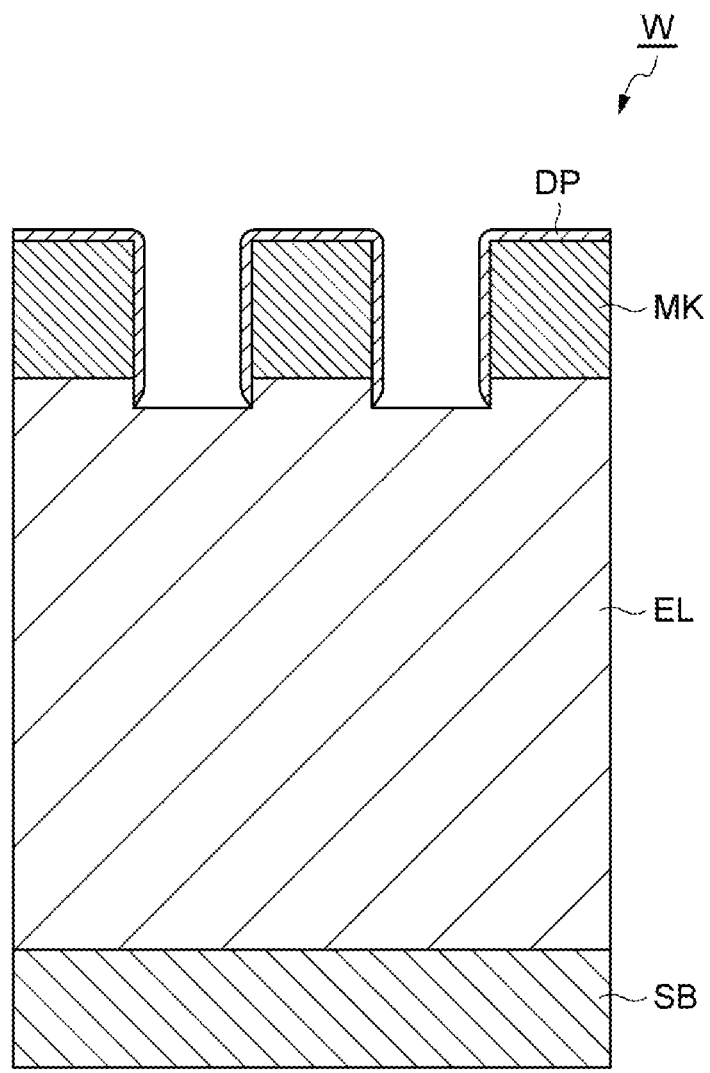
FIG. 7 is an enlarged cross-sectional view illustrating a part of the workpiece in a stage during the performance of the method illustrated in FIG. 1.
Figure 8:
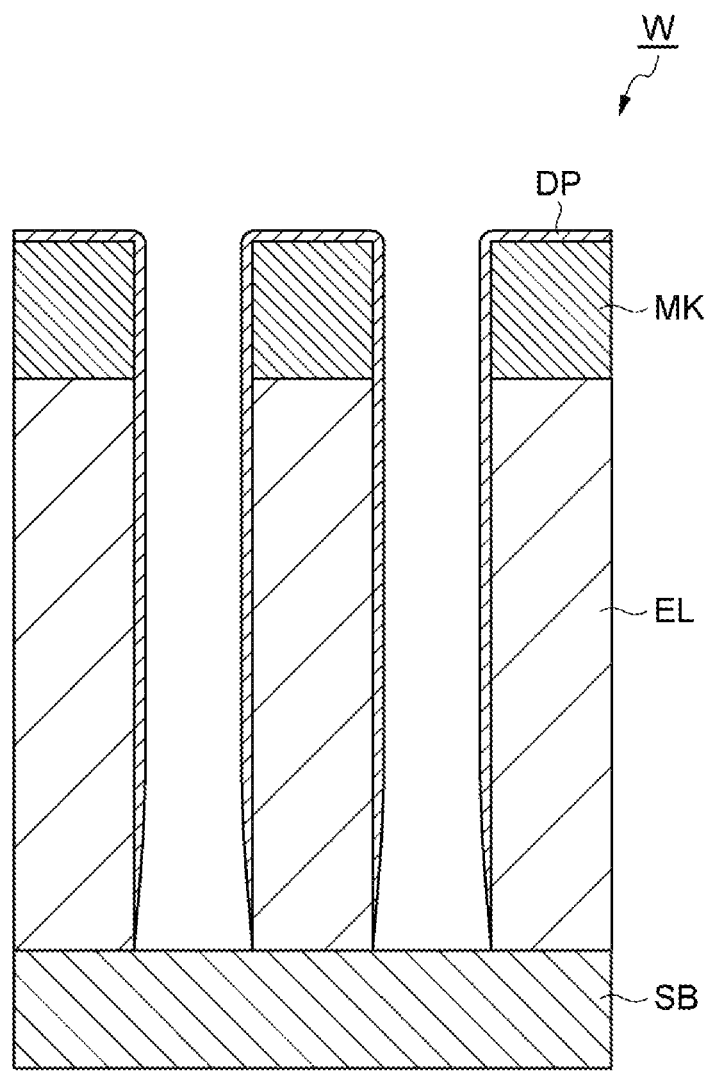
FIG. 8 is an enlarged cross-sectional view illustrating a part of the workpiece after the performance of the method illustrated in FIG. 1.

Referring back to FIG. 1, method MT will be described. In the following descriptions, FIGS. 4 to 8 will be referred together with FIG. 1. FIGS. 4 and 5 are cross-sectional views illustrating the workpiece in a stage during the performance of the method illustrated in FIG. 1. FIGS. 6 and 7 are enlarged cross-sectional views illustrating a part of the workpiece in a stage during the performance of the method illustrated in FIG. 1. FIG. 8 is an enlarged cross-sectional view illustrating a part of the workpiece after the performance of the method illustrated in FIG. 1. Hereinafter, method MT will be described with respect to a case of processing the wafer W illustrated in FIG. 2 using the plasma processing apparatus 10 by way of example.

In method MT, prior to performance of a plurality of sequences SQ, the wafer W accommodated in the processing container 12 of the plasma processing apparatus 10 is placed on the electrostatic chuck ESC, and hold by the electrostatic chuck ESC. In this state, as illustrated in FIG. 4, the edge of the wafer W is surrounded by the focus ring FR. The focus ring FR is disposed in the periphery of the wafer W during the performance of method MT.

Then, in method MT, a plurality of sequences SQ are performed. Each of the plurality of sequences SQ includes step ST1 and step ST2. In step ST1, plasma of a processing gas (a first processing gas) is generated in the processing container 12 in which the wafer W is accommodated. Therefore, in step ST1, the processing gas is supplied into the processing container 12 from a gas source selected among the plurality of gas sources of the gas source group 40. The processing gas contains a fluorocarbon gas. The processing gas may further contain a noble gas, for example, Ar gas. Further, in step ST1, the exhaust device 50 is operated, so that the pressure in the processing container 12 is set to a predetermined pressure. Further, in step ST1, the high frequency waves from the first high frequency power source 62 are supplied to the lower electrode LE. Furthermore, the high frequency bias from the second high frequency power source 64 may be supplied to the lower electrode LE. In step ST1 of an exemplary embodiment, a negative DC voltage from the power source 70 may be applied to the upper electrode 30.

In step ST1, plasma of the processing gas containing the fluorocarbon gas is generated, and dissociated fluorocarbon is deposited on the surface of the wafer W, so that a deposit DP is formed as illustrated in FIGS. 5 and 6. Further, the deposit DP is also formed on an object around the wafer W (in an example, the focus ring FR).

In step ST1, a condition may be selected such that the deposition of the dissociated deposit on the wafer W is dominant to the etching of the etching target layer EL by the active species generated by the dissociation of the fluorocarbon gas. Examples of the fluorocarbon gas include a fluorocarbon gas having many carbon atoms with respect to fluorine atoms in the molecule, for example, $C_4F_8$ gas, $C_4F_6$ gas. Further, a relatively low power may be set as the power of the high frequency waves of the first high frequency power source 62. Further, a relatively low power may be set as the power of the high frequency bias of the second high frequency power source 64.

Hereinafter, various conditions in step ST1 are exemplified.

Pressure in processing container: 10 mTorr (1.33 Pa) to 150 mTorr (20.00 Pa)
Processing gas
$C_4F_8$ gas: 5 sccm to 50 sccm
Ar gas: 500 sccm to 1,500 sccm
Power of high frequency waves for plasma generation: 100 W to 500 W
Power of high frequency bias: 0 W to 300 W
Negative DC voltage of power source 70: −1,000 V to 0 V In the subsequent step ST2, the etching target layer EL is etched. In step ST2, plasma of the processing gas (the second processing gas) is generated in the processing container 12 to facilitate reaction of the fluorocarbon in the deposit DP with the constituent material of the etching target layer EL. Therefore, in step ST2, the processing gas is supplied into the processing container 12 from a gas source selected among the plurality of gas sources of the gas source group 40. The processing gas contains an inert gas. In an exemplary embodiment, the inert gas is a noble gas such as Ar gas. The inert gas may be nitrogen gas. In another exemplary embodiment, the processing gas may contain a noble gas as the inert gas, and may further contain nitrogen gas. In still another exemplary embodiment, the processing gas may contain a noble gas and an oxygen-containing gas, and may further contain nitrogen gas. Further, in step ST2, the exhaust device 50 is operated, so that the pressure in the processing container 12 is set to a predetermined pressure. Further, in step ST2, the high frequency waves from the first high frequency power source 62 are supplied to the lower electrode LE. Further, in step ST2, the high frequency bias from the second high frequency power source 64 is supplied to the lower electrode LE. In step ST2 of an exemplary embodiment, a negative DC voltage from the power source 70 may be applied to the upper electrode 30.

Hereinafter, various conditions in step ST2 are exemplified.

Pressure in processing container: 10 mTorr (1.33 Pa) to 150 mTorr (20.00 Pa)
Processing gas
Ar gas: 500 sccm to 1,500 sccm
$N_2$ gas: 0 sccm to 400 sccm
$O_2$ gas: 0 sccm to 50 sccm
Power of high frequency waves for plasma generation: 100 W to 500 W
Power of high frequency bias: 0 W to 300 W
Negative DC voltage of power source 70: −1,000 V to 0 V In step ST2, plasma of the inert gas is generated, and ions contained in the plasma of the inert gas are drawn to the wafer W. Accordingly, the plasma of the inert gas generates fluorocarbon radicals. The fluorocarbon radicals react with the constituent material of the etching target layer EL, and reaction products are exhausted. As a result of the performance of step ST2, as illustrated in FIG. 7, the etching target layer EL is etched.

In method MT, it is determined whether a stop condition is satisfied in the subsequent step STJ. The stop condition is determined to be satisfied when the sequence SQ is performed a predetermined number of times. In step STJ, when it is determined that the stop condition is not satisfied, the sequence SQ is performed from step ST1. The etching target layer EL is gradually etched by the repetitive performance of the sequence SQ. Meanwhile, in step STJ, when it is determined that the stop condition is satisfied, method MT is ended. At the time of the end of method MT, as illustrated in FIG. 8, an opening is formed in the etching target layer EL to reach the surface of the substrate SB.

In step ST1 of method MT, the deposit DP is formed on the surface of the etching target layer EL and the mask MK, that is, the surface of the wafer W. The deposit DP has a function to protect the mask MK in step ST2. Further, the deposit DP becomes a source of radicals of the fluorocarbon for the etching of the etching target layer EL in step ST2. Therefore, according to method MT, it is possible to etch the etching target layer EL while protecting the mask MK. Further, the deposit DP formed in step ST1 is formed on the wafer W, as well as on an object around the edge of the wafer W, that is, the focus ring FR, as illustrated in FIG. 5. Thus, after the deposit DP is formed on the wafer W, the surface of the wafer W and the surface of the focus ring FR therearound are constituted by the deposit. Accordingly, consumption of fluorine becomes substantially uniform in the substantially entire areas of the surface of the wafer W. Further, the mask MK is protected by the deposit DP as described above. Thus, erosion of the mask MK is substantially uniformly suppressed in the plane of the wafer W. That is, erosion of the mask MK in the area R1 and the erosion of the mask MK in the area R2 are substantially uniformly suppressed. Therefore, according to method MT, the in-plane uniformity of the selection ratio is enhanced in the etching of the etching target layer EL.

Further, as described above, in step ST1 of an exemplary embodiment, a negative DC voltage from the power source 70 is applied to the upper electrode 30. Accordingly, the amount of the active species of fluorine generated in step ST1 is reduced, and the erosion of the mask MK is further suppressed. Further, as described above, in step ST2, a negative DC voltage from the power source 70 may also be applied to the upper electrode 30.

Further, as described above, the processing gas used in step ST2 of an exemplary embodiment includes nitrogen gas. In the exemplary embodiment, when the etching target layer EL contains hydrogen like a film, for example, the low-dielectric constant film as exemplified above, separation of the hydrogen from the etching target layer EL is facilitated by the active species of the nitrogen. Therefore, the etching target layer EL is more efficiently etched.

Further, as described above, the processing gas used in step ST2 of an exemplary embodiment includes an oxygen-containing gas. In the exemplary embodiment, an active species of oxygen is generated by generating the plasma of the oxygen-containing gas. The active species of oxygen contributes to removal of excess deposit DP. Thus, excessive reduction of the opening of the mask is suppressed.

Figure 9A:
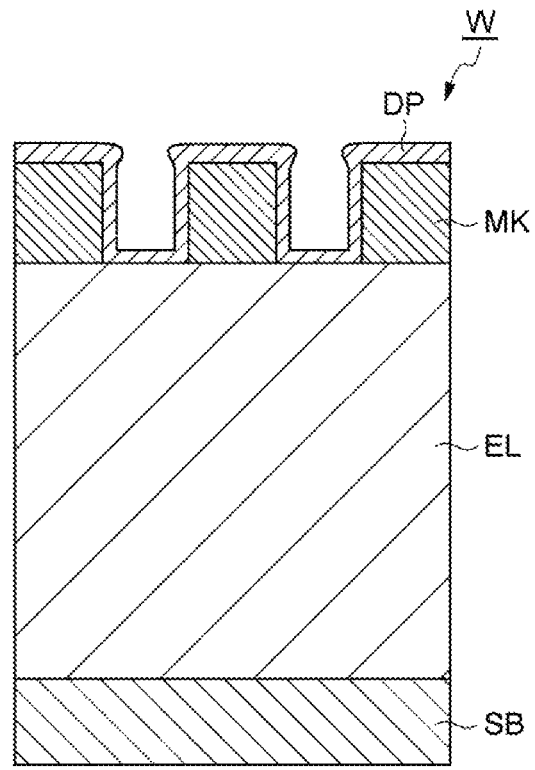
FIGS. 9A and 9B are enlarged cross-sectional views illustrating a part of the workpiece in a stage during the performance of the method illustrated in FIG. 1.
Figure 9B:
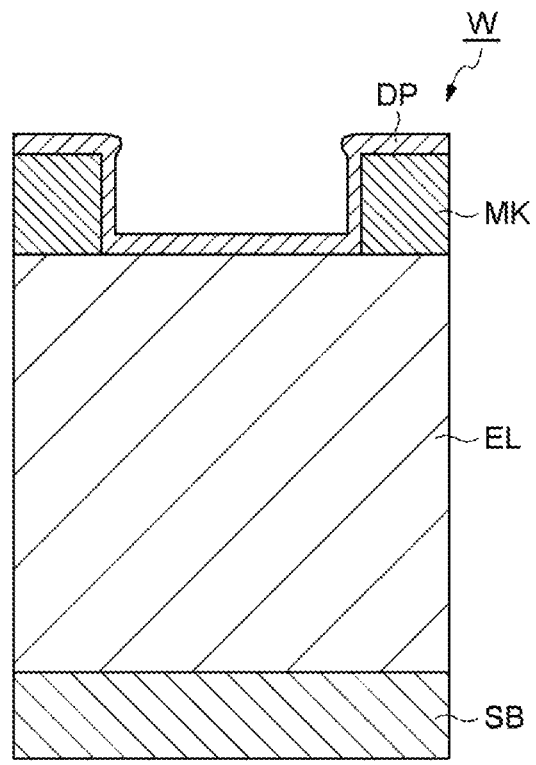

Here, FIGS. 9A and 9B will be referred to. FIGS. 9A and 9B are enlarged cross-sectional views illustrating a part of the workpiece in a stage during the performance of the method illustrated in FIG. 1. FIG. 9A illustrates a state of the deposit DP formed in a narrow area by the performance of step ST1. FIG. 9B illustrates a state of the deposit DP formed in a wide area by the performance of step ST1. As illustrated in FIGS. 9A and 9B, by the performance of step ST1, the deposit DP is formed more on the etching target layer EL in the wide area, as compared with the narrow area. Meanwhile, during the performance of step ST2, the amount of the deposit DP reduced by the active species of the oxygen is increased in the wide area, as compared with the narrow area. Therefore, the etching proceeds while reducing the difference between the amount of the deposit on the etching target layer EL in the narrow area and the amount of the deposit on the etching target layer EL in the wide area. Thus, the difference between the etching rate of the etching target layer EL in the narrow area and the etching rate of the etching target layer EL in the wide area is decreased.

Figure 10:
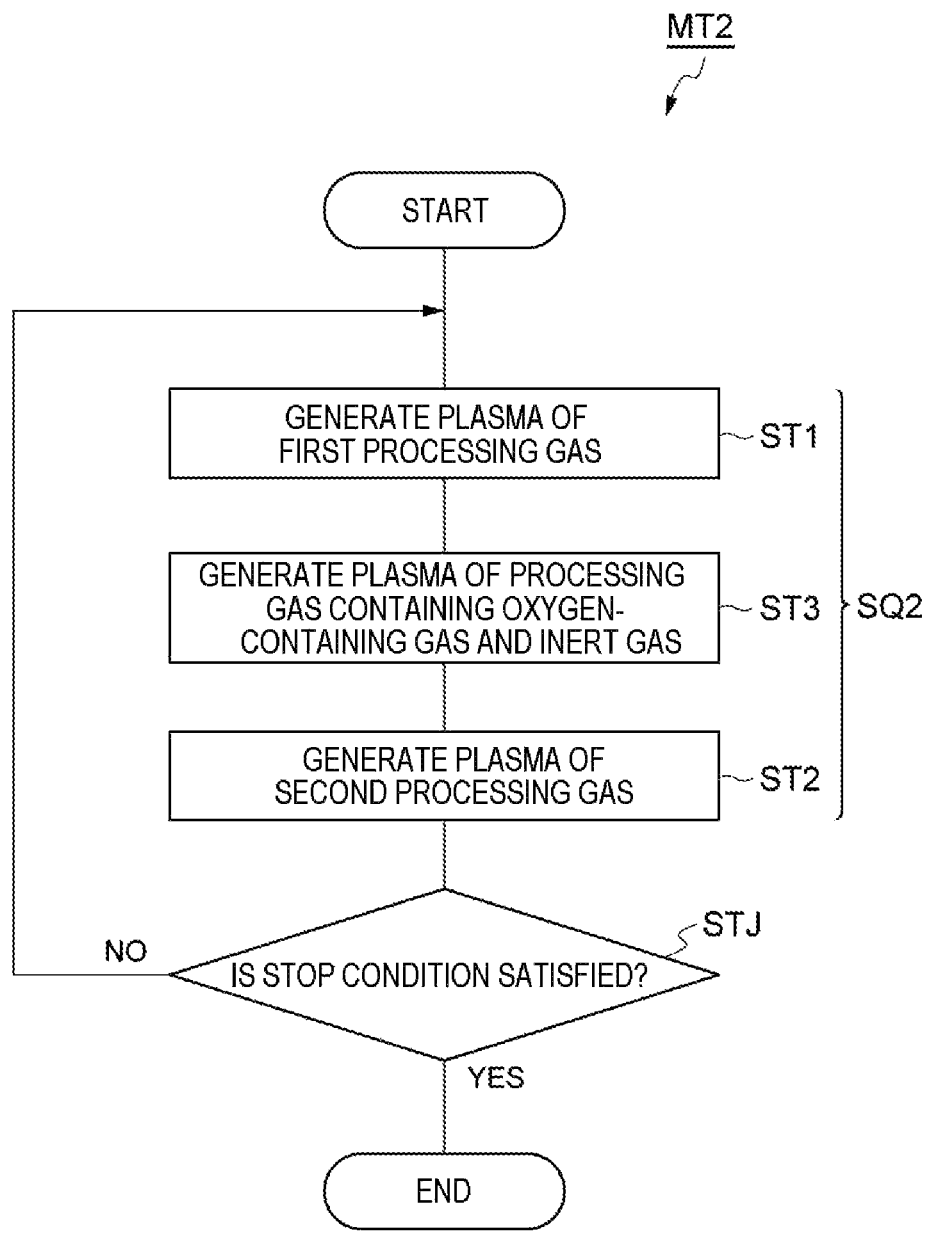
FIG. 10 is a flowchart illustrating an etching method according to another exemplary embodiment.

Hereinafter, an etching method according to another exemplary embodiment will be described. FIG. 10 is a flowchart illustrating an etching method according to another exemplary embodiment. Method MT2 illustrated in FIG. 10 includes a plurality of sequences SQ2. Each of the plurality of sequences SQ2 is different from the sequence SQ in that step ST3 is included between step ST1 and step ST2. Further, the processing gas used in step ST2 of the sequence SQ2 of method MT2 may not contain an oxygen-containing gas.

In step ST3 of the sequence SQ2, plasma of the processing gas containing an inert gas and an oxygen-containing gas is generated in the processing container 12. Therefore, in step ST3, the processing gas is supplied into the processing container 12 from a gas source selected among the plurality of gas sources of the gas source group 40. The processing gas contains, for example, oxygen gas ($O_2$ gas) as the oxygen-containing gas. Further, the processing gas contains nitrogen gas and/or a noble gas as the inert gas. Further, in step ST3, the exhaust device 50 is operated, so that the pressure in the processing container 12 is set to a predetermined pressure. Further, in step ST3, the high frequency waves from the first high frequency power source 62 are supplied to the lower electrode LE. Further, in step ST3, the high frequency bias from the second high frequency power source 64 may be supplied to the lower electrode LE. In step ST3 of an exemplary embodiment, a negative DC voltage from the power source 70 may be applied to the upper electrode 30.

Hereinafter, various conditions in step ST3 are exemplified.

Figure 11A:
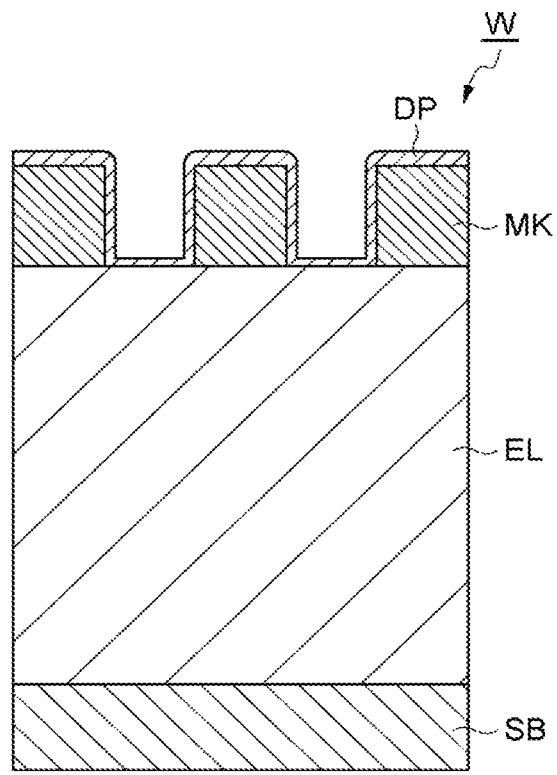
FIGS. 11A and 11B are enlarged cross-sectional views illustrating a part of the workpiece in a stage during the performance of the method illustrated in FIG. 10.
Figure 11B:
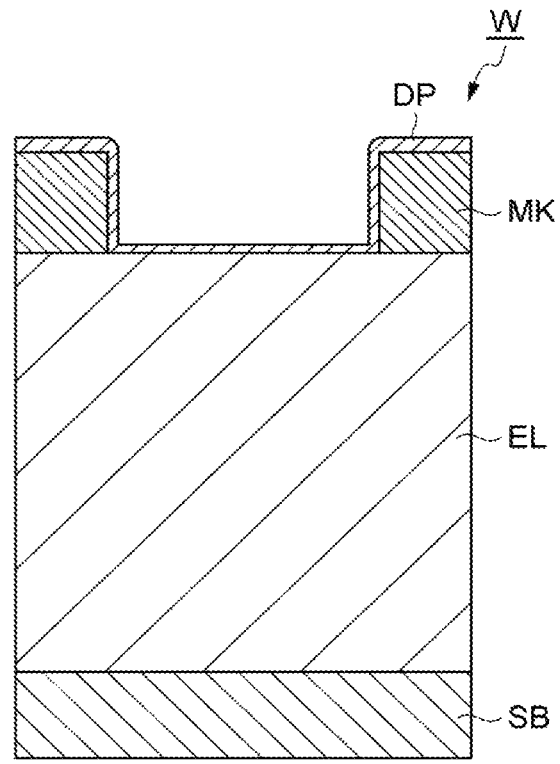

Pressure in processing container: 10 mTorr (1.33 Pa) to 150 mTorr (20.00 Pa)
Processing gas
  Ar gas: 500 sccm to 1,500 sccm
  $N_2$ gas: 0 sccm to 400 sccm
  $O_2$ gas: 5 sccm to 50 sccm
Power of high frequency waves for plasma generation: 100 W to 500 W
Power of high frequency bias: 0 W to 300 W
Negative DC voltage of power source 70: −1,000 V to 0 V Here, FIGS. 11A and 11B will be referred to. FIGS. 11A and 11B are enlarged cross-sectional views illustrating a part of the workpiece in a stage during the performance of the method illustrated in FIG. 10. Specifically, FIG. 11A illustrates a state of the deposit DP in the narrow area after the performance of step ST3. FIG. 11B illustrates a state of the deposit DP in the wide area after the performance of step ST3. As described with respect to method MT with reference to FIGS. 9A and 9B, also in method MT2, by the performance of step ST1, the deposit DP is formed more on the etching target layer EL in the wide area, as compared with the narrow area. In order to reduce the difference in amount of the deposit by the areas, plasma of the oxygen-containing gas is generated in step ST3. In step ST3, the amount of the deposit DP reduced by the active species of oxygen is increased in the wide area, as compared with the narrow area. As a result, as illustrated in FIGS. 11A and 11B, the difference between the amount of the deposit DP on the etching target layer EL in the narrow area and the amount of the deposit DP on the etching target layer EL in the wide area is decreased. Thus, the difference between the etching rate of the etching target layer EL in the narrow area and the etching rate of the etching target layer EL in the wide area is decreased. Further, in an exemplary embodiment of method MT, an oxygen-containing gas is contained in the processing gas used in step ST2. However, in method MT2, generation of plasma of the oxygen-containing gas is performed in step ST3 separate from step ST2. That is, in method MT2, step ST2 and step ST3 of generating the plasma of the oxygen-containing gas are separated from each other. Thus, the controllability of adjusting the amount of the deposit DP is enhanced.

As such, various exemplary embodiments have been described, but various modifications may be made without being limited to the exemplary embodiments described above. For example, the plasma processing apparatus used in the performance of method MT and method MT2 is not limited to the plasma processing apparatus 10. Method MT and method MT2 may be performed using any plasma processing apparatus such as, for example, an inductively coupled plasma processing apparatus and a plasma processing apparatus for generating plasma with surface waves such as microwaves.

Further, in the sequence SQ2 of method MT2, step ST3 is performed between step ST1 and step ST2. However, step ST3 may be performed after step ST2.

Hereinafter, descriptions will be made on test examples performed for evaluation of method MT and method MT2, but the present disclosure is not limited to the test examples.

Test Examples 1 to 7

Figure 12A:
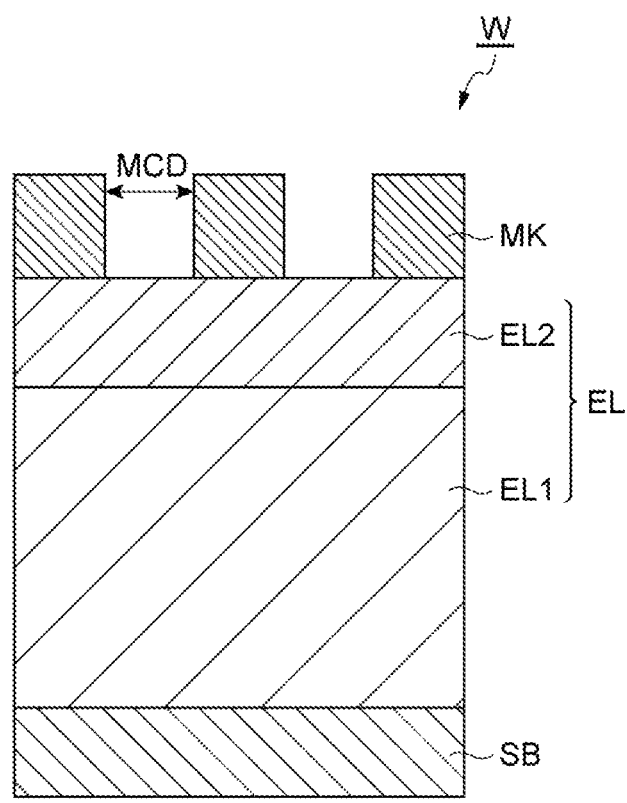
FIGS. 12A and 12B are views for explaining Test Examples 1 to 7 and Comparative Test Examples 1 to 7.

In Test Examples 1 to 7, a wafer with a diameter of 300 mm was prepared, which included an etching target layer EL on a substrate SB, and a mask MK on the etching target layer EL, as illustrated in FIG. 12A. The etching target layer EL had a first film EL1 made of Black Diamond (trade mark) with a thickness of 530 nm, and a second film EL2 which was a TEOS film with a thickness of 50 nm. In addition, the mask MK was made of TiN, had a thickness of 35 nm, and included a line-and-space pattern. The widths MCD of the openings (spaces) of the masks MK of the wafers prepared in Test Examples 1 to 7 were 40 nm, 44 nm, 50 nm, 75 nm, 126 nm, 275 nm, and 468 nm, respectively.

In Test Examples 1 to 7, method MT including sequences SQ of the following conditions was performed using the plasma processing apparatus 10 to etch the etching target layer EL. Further, the number of sequences SQ performed was 40.

<Step ST1>
  Pressure of space in processing container 12: 85 mT (11.33 Pa)
  Processing gas
    $C_4F_8$ gas: 30 sccm
    Ar gas: 1,000 sccm
  High frequency wave of first high frequency power source 62: 40 MHz, 300 W
  High frequency wave of second high frequency power source 64: 13 MHz, 100 W
  Negative DC voltage of power source 70: −300 V
  Processing time: 4 seconds
<Step ST2>
  Pressure of space in processing container 12: 85 mT (11.33 Pa)
  Processing gas
    Ar gas: 1,000 sccm N₂ gas: 20 sccm
O₂ gas: 12 sccm
High frequency wave of first high frequency power source 62: 40 MHz, 300 W
High frequency wave of second high frequency power source 64: 13 MHz, 100 W
Negative DC voltage of power source 70: −300 V
Processing time: 2 seconds Further, in Comparative Test Examples 1 to 7, the same wafers as in Test Examples 1 to 7 were prepared. Then, in Comparative Test Examples 1 to 7, the etching of the etching target layer EL was performed using the plasma processing apparatus 10 under the following conditions.

Figure 12B:
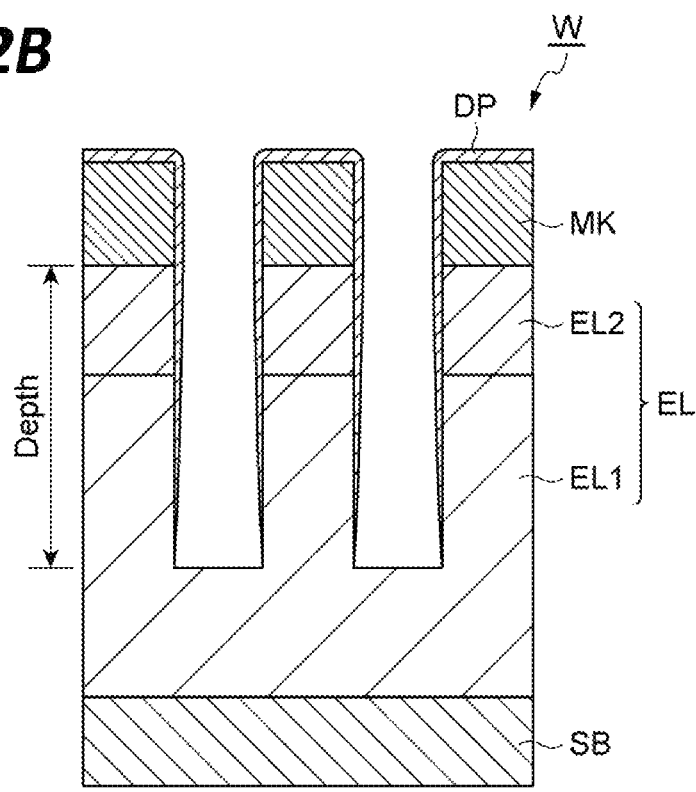
Figure 13:
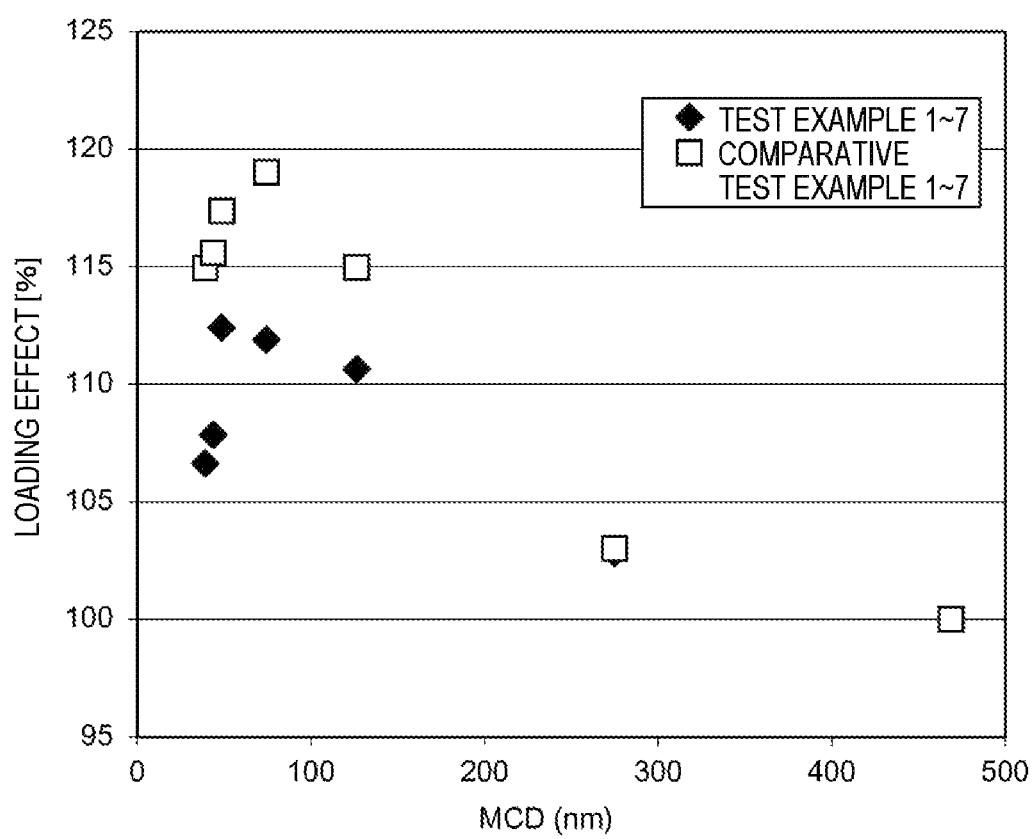
FIG. 13 is a graph illustrating the results of Test Examples 1 to 7 and Comparative Test Examples 1 to 7.

<Conditions of Comparative Test Examples 1 to 7)
Pressure of space in processing container 12: 85 mT (11.33 Pa)
Processing gas
$C_4F_8$ gas: 30 sccm
Ar gas: 1,000 sccm
N₂ gas: 20 sccm
O₂ gas: 12 sccm
High frequency wave of first high frequency power source 62: 40 MHz, 300 W
High frequency wave of second high frequency power source 64: 13 MHz, 100 W
Negative DC voltage of power source 70: −300 V
Processing time: 180 seconds Then, SEM images of the processed wafers of Test Examples 1 to 7 and Comparative Test Examples 1 to 7 were acquired. From each SEM image, a depth of the opening formed in the etching target layer EL (see FIG. 12B) was obtained. Results are illustrated in the graph of FIG. 13. In the graph of FIG. 13, the horizontal axis represents a width MCD of the opening of the mask MK, and the vertical axis represents a loading effect (%). The loading effect (%) with respect to Test Examples 1 to 7 is a value (%) obtained by normalizing the depths obtained from Test Examples 1 to 7 when the depth of Test Example 7 is set as 100%. Further, the loading effect (%) with respect to Comparative Test Examples 1 to 7 is a value (%) obtained by normalizing the depths obtained from Comparative Test Examples 1 to 7 when the depth of Comparative Test Example 7 is set as 100%. As illustrated in FIG. 13, in Comparative Test Examples 1 to 7, it has been confirmed that, when the widths MCD of the openings of the mask MK are different, the depths of the openings formed in the etching target layer EL are also considerably different. On the other hand, in Test Examples 1 to 7, it has been confirmed that, even though the widths MCD of the openings of the mask MK are different, the difference between the depths of the openings formed in the etching target layer EL is reduced. That is, in Test Examples 1 to 7, it has been confirmed that, even though a narrow area and a wide area are present in the wafer, the difference in etching rate in both areas is reduced.

Test Example 8

Figure 14A:
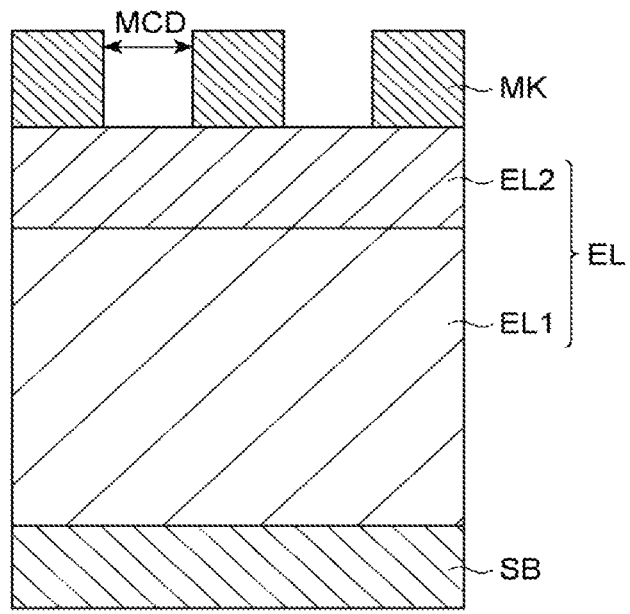
FIGS. 14A and 14B are views for explaining Test Example 8 and Comparative Test Example 8.

In Test Example 8, a wafer with a diameter of 300 mm was prepared, which included an etching target layer EL on a substrate SB, and a mask MK on the etching target layer EL, as illustrated in FIG. 14A. The etching target layer EL has a first film EL1 made of Black Diamond (trade mark) with a thickness of 530 nm, and a second film EL2 which was a TEOS film with a thickness of 50 nm. In addition, the mask MK was made of TiN, had a thickness of 35 nm, and included a line-and-space pattern. The width MCD of the opening (space) of the masks MK of the wafer prepared in Test Example 8 was 40 nm. In addition, in Test Example 8, method MT of the same conditions as in Test Examples 1 to 7 was performed using the plasma processing apparatus 10 to etch the etching target layer EL.

Further, in Comparative Test Example 8, the same wafer as in Test Example 8 was prepared, and the etching target layer EL was etched using the plasma processing apparatus 10 under the same conditions as in Comparative Test Examples 1 to 7.

Figure 14B:
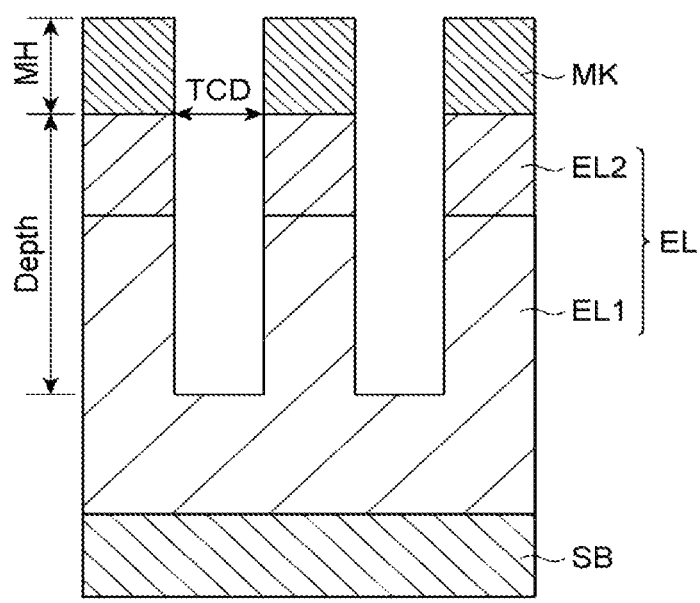

Then, a SEM image of the processed wafers of Test Example 8 was acquired, and a depth of the opening formed in the etching target layer EL, a thickness MH of the mask MK, and a width TCD at the upper end of the opening of the etching target layer EL (see FIG. 14B) were obtained. Results are illustrated in the table of FIG. 15. In the table of FIG. 15, the depths, the thicknesses MH, and the widths TCD, each measured at the center, at a position 10 mm away from the edge of the wafer, and at a position 5 mm away from the edge of the wafer, are illustrated. As illustrated in the table of FIG. 15, in Test Example 8, the thickness MH of the mask MK at the edge was greater as compared with that of Comparative Test Example 8. That is, in Test Example 8, it has been confirmed that erosion of the mask MK at the edge was suppressed. Further, in Test Example 8, it has been confirmed that, regardless of the areas in the wafer, the widths TCD of the upper end of the openings formed in the etching target layer EL become substantially uniform, and the difference in depth of the openings formed in the etching target layer EL is reduced.

Test Example 9

In Test Example 9, a wafer with a diameter of 300 mm that included a first film made of TiN, and a wafer with a diameter of 300 mm that included a second film of Black Diamond (trade mark) were prepared, and both films of the wafers, that is, the first film and the second film were etched using the plasma processing apparatus 10 under the same conditions as in Test Examples 1 to 7. Further, in Comparative Test Example 9, a wafer with a diameter of 300 mm that included a first film made of TiN, and a wafer with a diameter of 300 mm that included a second film of Black Diamond (trade mark) were prepared, and both films of the wafers, that is, the first film and the second film were etched using the plasma processing apparatus 10 under the same conditions as in Comparative Test Examples 1 to 7.

Figure 16A:
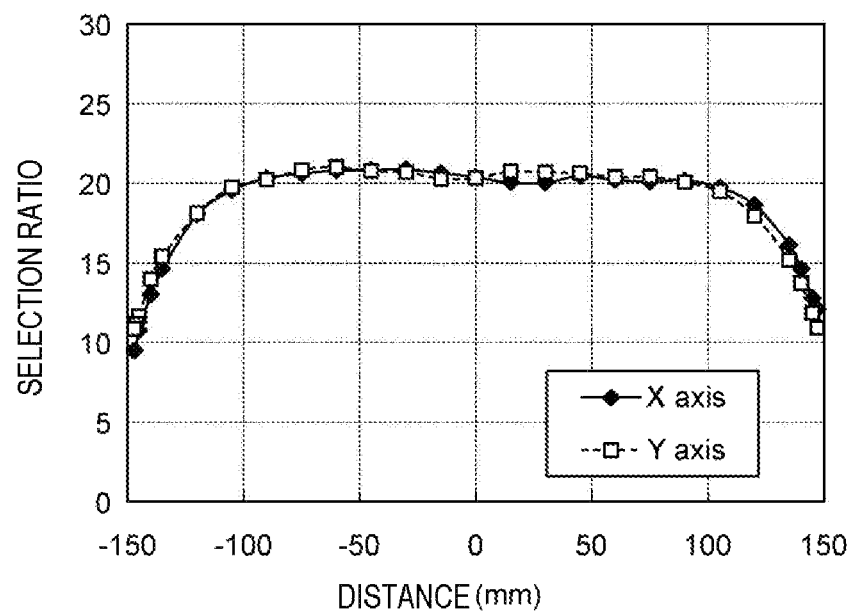
FIGS. 16A and 16B are graphs illustrating the results of Test Example 9 and Comparative Test Example 9.
Figure 16B:
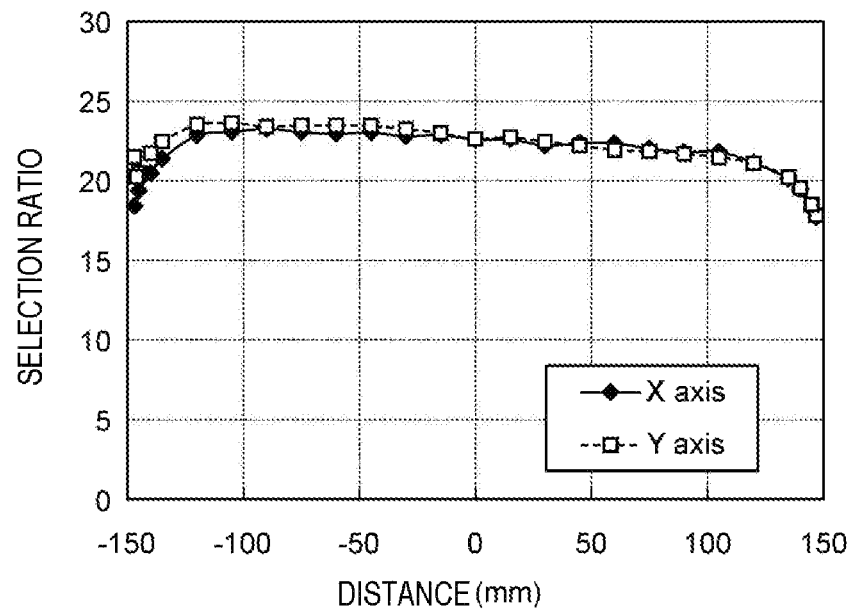

Then, in each of Test Example 9 and Comparative Test Example 9, a selection ratio was determined by dividing the difference in thickness of the second film before and after etching by the difference in thickness of the first film before and after etching. Further, the selection ratio was determined at a plurality of points on two diameters of the wafer orthogonal to each other (that is, the X-axis and the Y-axis). The result is illustrated in FIGS. 16A and 16B. FIG. 16A illustrates a graph of the selection ratio of Comparative Test Example 9, and FIG. 16B illustrates a graph of the selection ratio of Test Example 9. In the graphs of FIGS. 16A and 16B, the horizontal axis represents a distance from the center of the wafer at each point on the diameters of the wafer, and the horizontal axis represents a selection ratio. As illustrated in FIGS. 16A and 16B, in Test Example 9, it has been confirmed that the selection ratio at the edge of the wafer and the selection ratio in the central area of the wafer are considerably reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for etching, the method comprising:
disposing a workpiece having a silicon-containing layer formed with a mask thereon in a processing container that includes a focus ring configured to surround the workpiece;
forming a fluorocarbon-containing deposit on the mask, the silicon-containing layer, and the focus ring by plasma of a fluorocarbon gas; and
etching the silicon-containing layer using fluorocarbon radicals generated by exposing the deposit to plasma of an inert gas,
wherein, in the etching the silicon-containing layer, the generated fluorocarbon radicals react with the silicon-containing layer to form reaction products, and the reaction products are exhausted, and
wherein in the etching the silicon-containing layer, the inert gas is supplied in the processing container without supplying the fluorocarbon gas.

2. The method of claim 1, wherein the silicon-containing layer includes a plurality of films.

3. The method of claim 1, wherein the mask includes tungsten.

4. The method of claim 1, wherein the mask is made of titanium nitride.

5. The method of claim 1, wherein, in the etching the silicon-containing layer, an oxygen-containing gas is supplied to the processing container along with the inert gas.

6. The method of claim 1, further comprising:
before generating the plasma of the inert gas, generating third plasma of a third processing gas containing an oxygen-containing gas and an inert gas in the processing container.

7. The method of claim 1, wherein the silicon-containing layer includes silicon oxide.

8. The method of claim 1, wherein the mask has a first opening and a second opening narrower than the first opening, and
an amount of the fluorocarbon-containing deposit in the first opening is greater than an amount of the fluorocarbon-containing deposit in the second opening.

9. The method of claim 8, wherein etching is performed using a plasma containing oxygen before, during or after the etching performed with the plasma of the inert gas, and the plasma containing oxygen reduces differences in the amount of the fluorocarbon-containing deposit in the second opening compared to the first opening; and
wherein at commencement of etching with the plasma containing oxygen or plasma of the inert gas, the fluorocarbon-containing deposit is present on a top surface of the focus ring at a location surrounding an outer periphery of the workpiece to reduce differences in erosion of the mask at outer peripheral areas of the workpiece with respect to erosion of the mask in more central areas of the workpiece.

10. The method of claim 9, wherein after forming the fluorocarbon-containing deposit and prior to etching with the plasma containing oxygen or plasma of the inert gas, a flow of the fluorocarbon gas used in forming the fluorocarbon-containing deposits is discontinued;
wherein the focus ring comprises a silicon focus ring; and
wherein the mask is a metal-containing mask.

11. The method of claim 1, wherein the plasma is an inductively-coupled plasma (ICP) plasma.

12. The method of claim 1, wherein the second processing gas further includes nitrogen gas.

13. The method of claim 1, wherein the silicon-containing layer is a low-dielectric constant (Low-K) film.

14. The method of claim 1, wherein a deposition time of the forming the fluorocarbon-containing deposit is longer than an etching time of the etching the silicon-containing layer.

15. The method of claim 1, wherein a deposition pressure in the forming the fluorocarbon-containing deposit and an etching pressure in the etching the silicon-containing layer are the same.

16. The method of claim 1, wherein the fluorocarbon gas is a gas in which a ratio of the number of carbon atoms to the number of fluorine atoms is 1/4 or more.

17. The method of claim 16, wherein the fluorocarbon gas is $C_4F_8$ or $C_4F_6$.

18. The method of claim 1, wherein the forming the fluorocarbon-containing deposit and the etching the silicon-containing layer are continuously performed by flowing the inert gas at the same flow rate.

19. The method of claim 1, wherein a material constituting the focus ring and a material constituting the silicon-containing layer are different.

20. The method of claim 1, wherein the etching of the silicon-containing layer includes supplying bias power to the workpiece such that ions in the plasma of the inert gas are drawn to the fluorocarbon-containing deposit.

21. The method of claim 1, wherein during forming of the fluorocarbon-containing deposit on the mask, the silicon-containing layer and the focus ring, deposition is dominant to etching with respect to the silicon-containing layer, and
wherein a flow of the fluorocarbon gas used in forming the fluorocarbon-containing deposit is discontinued during the etching of the silicon-containing layer.

22. The method of claim 1, wherein the fluorocarbon-containing deposit is present on a top surface of the focus ring at commencement of the etching of the silicon-containing layer, at a location surrounding an outer periphery of the workpiece.

23. The method of claim 22, wherein the focus ring comprises a silicon focus ring, and the mask includes tungsten or titanium nitride.

24. A method for etching, the method comprising:
disposing a workpiece having an etching target layer formed with a mask thereon in a processing container that includes a focus ring configured to surround the workpiece;
forming a deposit on the mask, the etching target layer, and the focus ring by a first plasma of a first gas; and
etching the etching target layer using radicals generated by exposing the deposit to a second plasma of a second gas different from the first plasma,
wherein, in the etching the etching target layer, the generated radicals react with the etching target layer to form reaction products, and the reaction products are exhausted, and
wherein in the etching the etching target layer, the second gas is supplied in the processing container without supplying the first gas.

25. A method for etching, the method comprising:
disposing a workpiece having a silicon-containing layer formed with a metal-containing mask thereon in a processing container that includes a focus ring configured to surround the workpiece;

generating a first plasma of a first processing gas containing a fluorocarbon gas in the processing container to form a fluorocarbon-containing deposit on the metal-containing mask, the silicon-containing layer, and the focus ring, and wherein during forming of the fluorocarbon-containing deposit on the metal-containing mask, the silicon-containing layer and the focus ring, deposition is dominant to etching with respect to the silicon-containing layer;

generating a second plasma of a second processing gas containing an inert gas in the processing container to etch the silicon-containing layer by a reaction of the silicon-containing layer with fluorocarbon radicals contained in the fluorocarbon-containing deposit, and wherein a flow of the fluorocarbon gas used in generating the first plasma is discontinued during generating the second plasma; and alternately repeating the generating the first plasma and the generating the second plasma, wherein, in the generating the second plasma, the fluorocarbon radicals react with the silicon-containing layer to form reaction products, and the reaction products are exhausted, and in the generating the second plasma, the inert gas is supplied in the processing container without supplying the fluorocarbon gas.

26. The method of claim 25, wherein the focus ring comprises a silicon focus ring, and wherein the fluorocarbon-containing deposit on the focus ring is present on a top surface of the focus ring at commencement of the generating the second plasma, at a location surrounding an outer periphery of the workpiece.

27. The method of claim 25, wherein the second processing gas further includes oxygen.

28. The method of claim 25, wherein the second processing gas includes argon, nitrogen and oxygen.

29. The method of claim 25, further including generating a third plasma of a third processing gas comprising oxygen before or after the generating the second plasma.

30. The method of claim 25, further including determining whether the alternately repeating has been performed a predetermined number of times, and discontinuing the alternately repeating after it is determined to have been performed the predetermined number of times.

* * * * *